United States Patent
Usami et al.

(10) Patent No.: US 10,151,881 B2
(45) Date of Patent: Dec. 11, 2018

(54) SEMICONDUCTOR DEVICE AND MANUFACTURING METHOD OF THE SAME

(71) Applicant: Renesas Electronics Corporation, Koutou-ku, Tokyo (JP)

(72) Inventors: Tatsuya Usami, Ibaraki (JP); Keiji Sakamoto, Ibaraki (JP); Hiroyuki Kunishima, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/647,838

(22) Filed: Jul. 12, 2017

(65) Prior Publication Data
US 2017/0307824 A1 Oct. 26, 2017

Related U.S. Application Data

(63) Continuation of application No. 15/068,547, filed on Mar. 12, 2016, now Pat. No. 9,739,943.

(30) Foreign Application Priority Data

Mar. 30, 2015 (JP) .................................. 2015-067928

(51) Int. Cl.
*G02B 6/12* (2006.01)
*G02B 6/134* (2006.01)
(Continued)

(52) U.S. Cl.
CPC ........... *G02B 6/1347* (2013.01); *G02B 6/122* (2013.01); *G02B 6/12004* (2013.01);
(Continued)

(58) Field of Classification Search
CPC .. G02B 6/1347; G02B 6/122; G02B 6/12004; G02B 6/136; G02B 2006/12061; G02B 2006/121; G02F 1/025; H01L 23/562
See application file for complete search history.

(56) References Cited

U.S. PATENT DOCUMENTS 5,838,870 A    11/1998   Soref
7,023,891 B2    4/2006   Haneda et al.
(Continued)

FOREIGN PATENT DOCUMENTS

| EP | 3073301 A1 * | 9/2016 | ............. G02B 6/122 |
| JP | H07-74328 A | 3/1995 | |
| JP | 2000-031252 A | 1/2000 | |

OTHER PUBLICATIONS

Office Action, dated Aug. 7, 2018, in Japanese Patent Application No. 2015-067928.

*Primary Examiner* — Ellen Kim

(74) *Attorney, Agent, or Firm* — Shapiro, Gabor and Rosenberger, PLLC

(57) ABSTRACT

A rectangular optical waveguide, an optical phase shifter and an optical modulator each formed of a semiconductor layer are formed on an insulating film constituting an SOI wafer, and then a rear insulating film formed on a rear surface of the SOI wafer is removed. Moreover, a plurality of trenches each having a first depth from an upper surface of the insulating film are formed at a position not overlapping with the rectangular optical waveguide, the optical phase shifter and the optical modulator when seen in a plan view in the insulating film. As a result, since an electric charge can be easily released from the SOI wafer even when the SOI wafer is later mounted on the electrostatic chuck included in the semiconductor manufacturing apparatus, the electric charge is less likely to be accumulated on the rear surface of the SOI wafer.

11 Claims, 12 Drawing Sheets

(51) Int. Cl.
*G02B 6/122* (2006.01)
*G02F 1/025* (2006.01)
*G02B 6/136* (2006.01)
*H01L 23/00* (2006.01)

(52) U.S. Cl.
CPC .............. *G02F 1/025* (2013.01); *G02B 6/136* (2013.01); *G02B 2006/121* (2013.01); *G02B 2006/12061* (2013.01); *H01L 23/562* (2013.01)

(56) References Cited

U.S. PATENT DOCUMENTS

| | | |
|---|---|---|
| 9,206,526 B2 | 12/2015 | Liu |
| 2010/0140776 A1 | 6/2010 | Trezza |
| 2012/0287959 A1 | 11/2012 | Tani et al. |
| 2013/0015546 A1* | 1/2013 | Joe ..................... G02B 6/12002 257/432 |
| 2013/0020556 A1* | 1/2013 | Bowers ................. B82Y 20/00 257/21 |
| 2013/0070798 A1 | 3/2013 | Sakaino et al. |
| 2014/0120652 A1 | 5/2014 | Kawamura |
| 2015/0171259 A1 | 6/2015 | Hartmann et al. |
| 2015/0194460 A1* | 7/2015 | Maekawa ......... H01L 27/14685 438/70 |
| 2015/0277041 A1* | 10/2015 | Nakagawa ............. G02B 6/122 385/14 |
| 2016/0276487 A1 | 9/2016 | Yamazaki et al. |

* cited by examiner

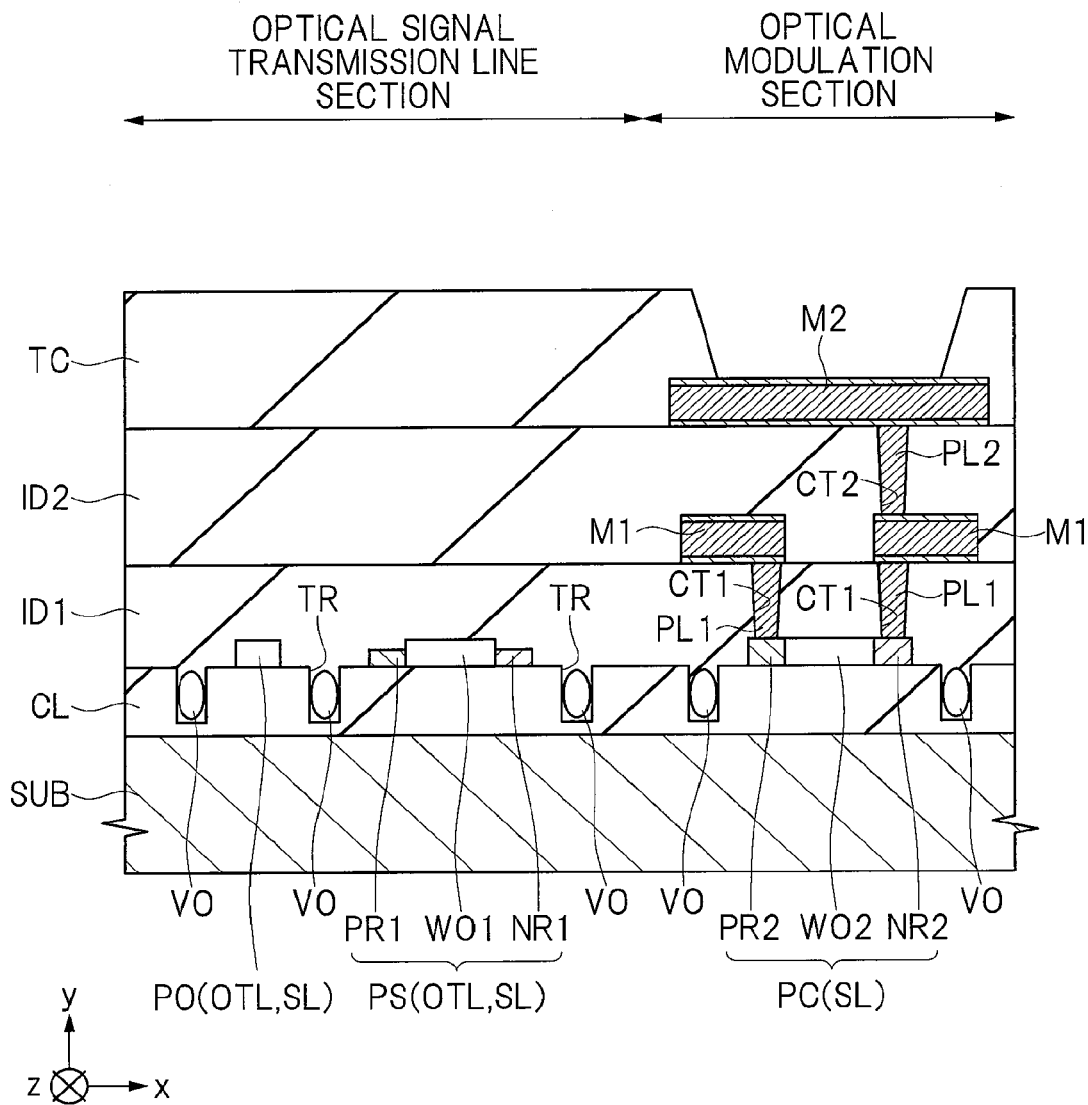

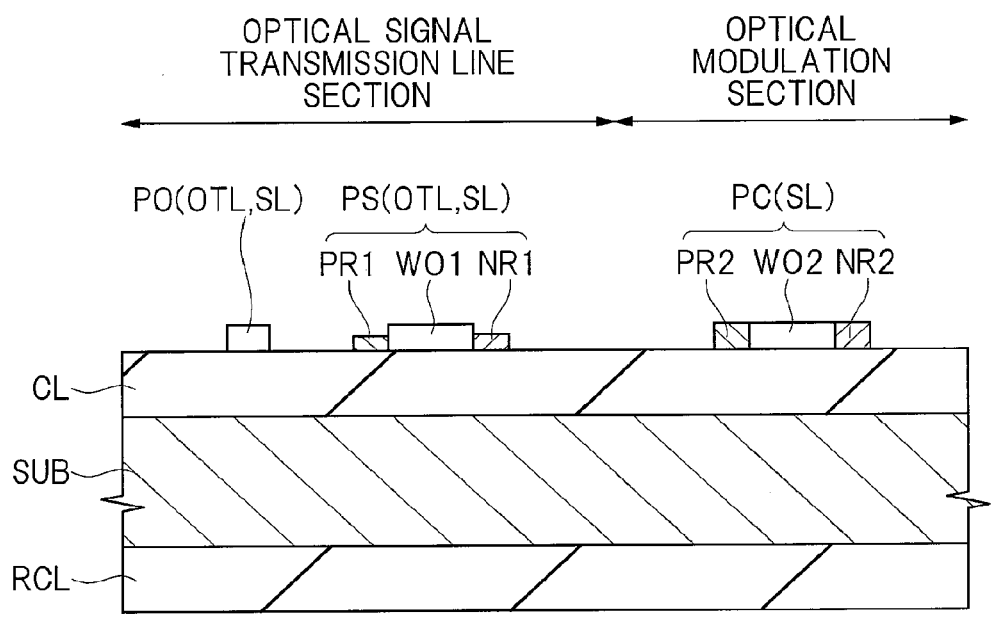
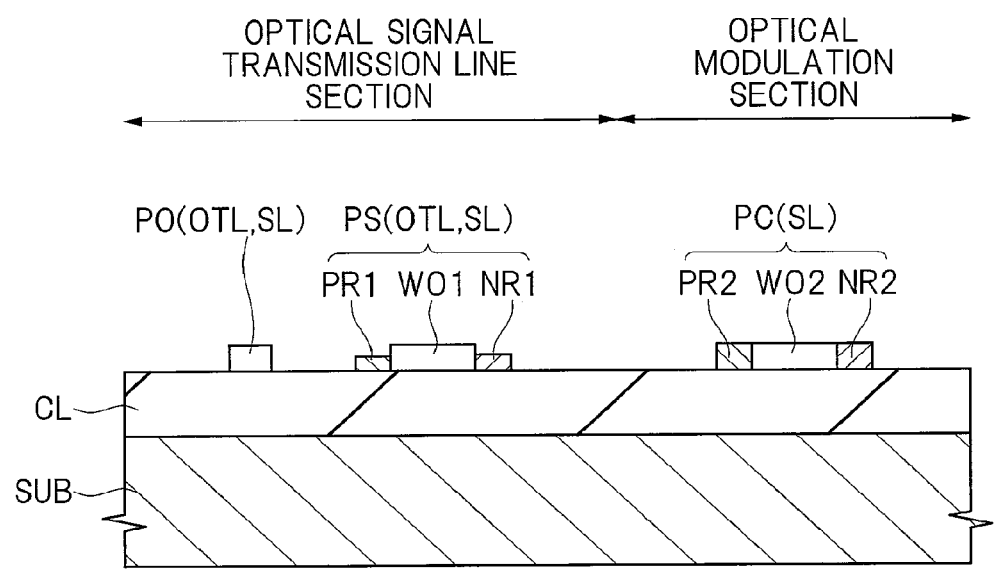

SEMICONDUCTOR DEVICE AND MANUFACTURING METHOD OF THE SAME

CROSS-REFERENCE TO RELATED APPLICATION

The present application claims priority from Japanese Patent Application No. 2015-067928 filed on Mar. 30, 2015, the content of which is hereby incorporated by reference into this application.

TECHNICAL FIELD OF THE INVENTION

The present invention relates to a semiconductor device and a manufacturing method of the same, and can be effectively applied to, for example, a semiconductor device using an SOI (Silicon On Insulator) substrate and manufacture of the semiconductor device.

BACKGROUND OF THE INVENTION

Japanese Patent Application Laid-Open Publication No. H07-74328 (Patent Document 1) discloses a technique in which a first semiconductor substrate to be an SOI layer and a second semiconductor substrate to be a support substrate are brought into close contact with each other in a clean atmosphere and are thus directly joined together. Warpage of the SOI substrate can be reduced by forming a trench in an oxide film of the first semiconductor substrate to be the SOI layer.

Japanese Patent Application Laid-Open Publication No. 2000-31252 (Patent Document 2) discloses a technique in which a thickness of an oxide film formed on a rear surface of a wafer is detected prior to processing the wafer and a series of voltage sequences (separation sequences) is applied in accordance with the thickness. The wafer is smoothly separated by the application of the separation sequences.

SUMMARY OF THE INVENTION

A semiconductor manufacturing apparatus uses an electrostatic chuck as a way of adsorbing and holding a wafer. The electrostatic chuck can adsorb the entire surface of the wafer and is particularly used to hold a large-diameter wafer. However, in the case of a wafer formed of an SOI substrate with a rear insulating film (hereinafter referred to as "SOI wafer"), residual adsorption force of the electrostatic chuck is not reduced due to an electric charge remaining in the SOI wafer, so that the SOI wafer is stuck to the electrostatic chuck in some cases. This sometimes causes such troubles as the cracking of the SOI wafer and the conveyance failure when separating the SOI wafer from the electrostatic chuck.

The other objects and novel characteristics of the present invention will be apparent from the description of the present specification and the accompanying drawings.

A semiconductor device according to an embodiment includes: a semiconductor substrate; a first insulating film formed on a main surface of the semiconductor substrate; an optical waveguide made of a semiconductor layer formed on the first insulating film; and a second insulating film formed on the first insulating film so as to cover the optical waveguide, and a trench having a first depth from an upper surface of the first insulating film is formed at a position not overlapping with the optical waveguide when seen in a plan view.

A manufacturing method of a semiconductor device according to an embodiment includes: a step of preparing an SOI substrate having a semiconductor substrate, a first insulating film formed on a main surface of the semiconductor substrate, a semiconductor layer formed on an upper surface of the first insulating film, and a rear insulating film formed on a rear surface of the semiconductor substrate; and a step of processing the semiconductor layer to form an optical waveguide formed of the semiconductor layer. The method further includes: a step of removing the rear insulating film; a step of forming a trench having a first depth from the upper surface of the first insulating film at a position not overlapping with the optical waveguide when seen in a plan view in the first insulating film; a step of forming a second insulating film on the first insulating film including an inside of the trench so as to cover the optical waveguide; a step of forming a connection hole reaching the optical waveguide in the second insulating film; and a step of forming a wiring electrically connected to the semiconductor layer through the connection hole on the second insulating film.

According to an embodiment, the SOI wafer can be adsorbed to and separated from the electrostatic chuck included in the semiconductor manufacturing apparatus without causing any trouble.

BRIEF DESCRIPTIONS OF THE DRAWINGS

FIG. 1 is a cross-sectional view of a principal part of a semiconductor device of the first embodiment;

FIG. 2 is a cross-sectional view of a principal part showing a manufacturing process of the semiconductor device of the first embodiment;

FIG. 3 is a cross-sectional view of a principal part showing the manufacturing process of the semiconductor device continued from FIG. 2;

DESCRIPTIONS OF THE PREFERRED EMBODIMENTS

Figure 4:
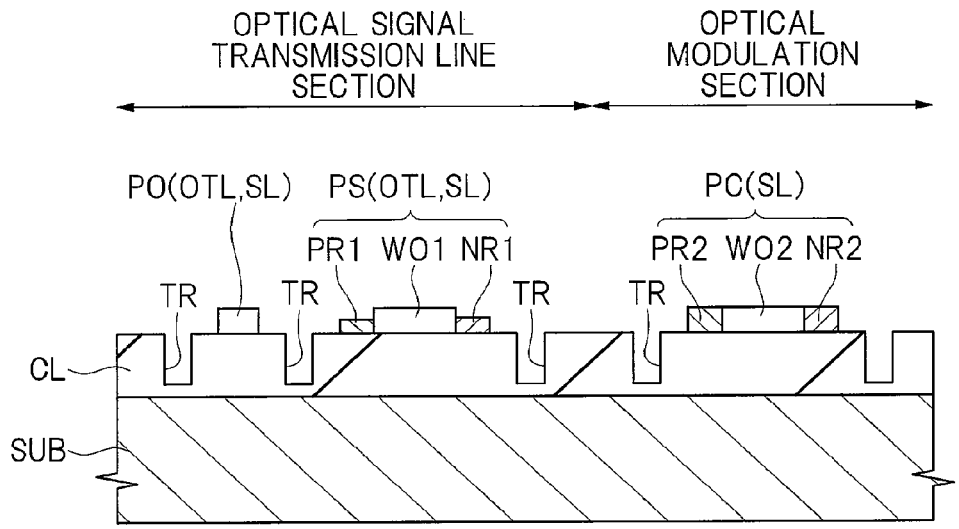
FIG. 4 is a cross-sectional view of a principal part showing the manufacturing process of the semiconductor device continued from FIG. 3.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable.

Further, in the embodiments described below, it goes without saying that the components (including element steps) are not always indispensable unless otherwise stated or except the case where the components are apparently indispensable in principle.

Further, even when mentioning that constituent elements or the like are "made of A", "constituted of A", "have A" and "include A", elements other than A are of course not excluded except the case where it is particularly specified that A is the only element thereof. Similarly, in the embodiments described below, when the shape of the components, positional relation thereof and the like are mentioned, the substantially approximate and similar shapes and the like are included therein unless otherwise stated or except the case where it is conceivable that they are apparently excluded in principle. The same goes for the numerical value and the range described above.

In addition, components having the same function are denoted by the same reference characters throughout the drawings for describing the embodiments, and the repetitive description thereof will be omitted. Hereinafter, embodiments of the present invention will be described in detail with reference to the accompanying drawings.

First Embodiment

In recent years, the development of the technology to realize an optical communication module by fabricating an optical signal transmission line made of silicon and integrating various optical devices and electronic devices with using an optical circuit constituted of the optical signal transmission line as a platform, that is, the silicon photonics technology has been actively pursued.

Hereinafter, a structure of a semiconductor device employing the silicon photonics technology and a manufacturing method of the semiconductor device according to the first embodiment will be described. A semiconductor device having an optical signal transmission line section and an optical modulation section integrated on an SOI substrate will be illustrated as an example in the first embodiment, but the present invention is not limited to this. In addition, a semiconductor device having a multilayer wiring with a two-layer structure will be illustrated as an example in the first embodiment, but the present invention is not limited to this.

<Structure of Semiconductor Device>

The structure of the semiconductor device of the first embodiment will be described with reference to FIG. 1. FIG. 1 is a cross-sectional view of a principal part of the semiconductor device of the first embodiment.

1. Optical Signal Transmission Line Section

As shown in FIG. 1, a variety of optical signal transmission lines (also referred to as optical signal lines) OTL are formed in an optical signal transmission line section. The optical signal transmission line OTL is constituted of a semiconductor layer (referred to also as SOI layer) SL made of silicon (Si) formed on a semiconductor substrate SUB made of single crystal silicon (Si) with an insulating film (referred to also as BOX layer or lower cladding layer) CL interposed therebetween. A thickness of the insulating film CL is, for example, 1 µm or more and preferably about 2 to 3 µm. Since the insulating film CL is formed relatively thick in this manner, electrostatic capacitance between the semiconductor substrate SUB and the semiconductor layer SL can be reduced. A preferable range of the thickness of the semiconductor layer SL appears to be, for example, 100 nm to 300 nm (of course not limited to this range depending on other conditions), and a range around a center value of 200 nm appears to be the most preferable range.

Here, a rectangular optical waveguide PO and an optical phase shifter PS that changes the phase of light will be described as examples of the optical signal transmission line OTL. Each of the rectangular optical waveguide PO and the optical phase shifter PS is constituted of the semiconductor layer SL formed on the semiconductor substrate SUB with the insulating film CL interposed therebetween.

The semiconductor layer SL of the rectangular optical waveguide PO is processed into a plate-like shape and extends in a direction perpendicular to the plane of the paper (z direction shown in FIG. 1). Therefore, the optical signal introduced into the rectangular optical waveguide PO travels in the direction perpendicular to the plane of the paper. A height of the rectangular optical waveguide PO (dimension in a longitudinal direction (y direction shown in FIG. 1)) is, for example, about 200 nm. An impurity is introduced into the rectangular optical waveguide PO, and an impurity concentration thereof falls within a range of, for example, $10^{15}$ to $10^{19}$ $cm^{-3}$, and a representative value thereof is, for example, about $10^{15}$ $cm^{-3}$.

The semiconductor layer SL of the optical phase shifter PS is processed into a rib shape. A thick portion (rib portion) of the semiconductor layer SL corresponds to an optical waveguide (also referred to as core layer) WO1 and extends in the direction perpendicular to the plane of the paper (z direction in FIG. 1). Thus, the optical signal introduced into the optical waveguide WO1 travels in the direction perpendicular to the plane of the paper. A height of the optical waveguide WO1 (dimension in a longitudinal direction (y direction shown in FIG. 1)) is, for example, about 200 nm, and a width (dimension in a lateral direction (x direction in FIG. 1)) is, for example, about 500 nm. Also, an impurity is introduced into the optical waveguide WO1 and an impurity concentration thereof falls within the range of, for example, $10^{15}$ to $10^{19}$ $cm^3$, and a representative value thereof is, for example, about $10^{15}$ $cm^{-3}$.

The semiconductor layer SL on both sides of the optical waveguide WO1 is reduced in thickness. A thickness of the part of the semiconductor layer SL reduced in thickness is, for example, about 50 nm. A p type impurity is introduced into the semiconductor layer SL on one side (left side in the drawing) of the optical waveguide WO1 to form a p type semiconductor PR1. The p type semiconductor PR1 is formed to be in parallel to the optical waveguide WO1. Also, in the semiconductor layer SL on the other side (right side in the drawing) of the optical waveguide WO1, an n type impurity is introduced to form an n type semiconductor NR1. The n type semiconductor NR1 is formed to be in parallel to the optical waveguide WO1. Namely, the semiconductor layer SL between the p type semiconductor PR1 and the n type semiconductor NR1 serves as the optical waveguide WO1.

A carrier is injected to the optical waveguide WO1 when forward bias is applied to the structure mentioned above. When the carrier is injected to the optical waveguide WO1, a carrier plasma effect (phenomenon caused when an optically-generated carrier increases electron-hole pair (plasma)) occurs in the optical waveguide WO1 to change a refractive index of light in the optical waveguide WO1. When the refractive index of light in the optical waveguide WO1 is changed, the wavelength of light traveling through the optical waveguide WO1 is changed, and thus it is possible to change the phase of light in the process of traveling through the optical waveguide WO1.

The optical signal transmission line OTL is covered with a first interlayer insulating film (also referred to as upper cladding layer) ID1, a second interlayer insulating film ID2 and a protection film TC. Each of the first interlayer insulating film ID1 and the second interlayer insulating film ID2 is made of, for example, silicon oxide ($SiO_2$) and a thickness thereof is, for example, 1 µm or more. The protection film TC is made of, for example, silicon oxynitride (SiON). A first-layer wiring M1 and a second-layer wiring M2 to be described later are not formed in the optical signal transmission line section.

2. Optical Modulation Section

As shown in FIG. 1, an optical modulator PC which converts an electric signal into an optical signal is formed in the optical modulation section. The optical modulator PC is constituted of the semiconductor layer SL made of silicon (Si) formed on the semiconductor substrate SUB with the insulating film CL interposed therebetween. Here, the optical modulator PC with a pin structure will be described by way of example.

The optical modulator PC having the pin structure is constituted of the semiconductor layer SL formed on the semiconductor substrate SUB with the insulating film CL interposed therebetween like the optical signal transmission line OTL described above.

An optical waveguide (also referred to as core layer) WO2 constituted of the semiconductor layer SL extends in the direction perpendicular to the plane of the paper (z direction in FIG. 1). Therefore, the optical signal introduced into the optical waveguide WO2 travels in the direction perpendicular to the plane of the paper. No impurity is introduced into the optical waveguide WO2, and the optical waveguide WO2 is thus made of an intrinsic semiconductor, that is, i-type semiconductor.

A p type impurity is introduced into the semiconductor layer SL on one side (left side in the drawing) of the optical waveguide WO2 to form a p type semiconductor PR2. The p type semiconductor PR2 is formed to be in parallel to the optical waveguide WO2. Also, an n type impurity is introduced into the semiconductor layer SL on the other side (right side in the drawing) of the optical waveguide WO2 to form an n type semiconductor NR2. The n type semiconductor NR2 is formed to be in parallel to the optical waveguide WO2. Namely, the semiconductor layer SL between the p type semiconductor PR2 and the n type semiconductor NR2 serves as the optical waveguide WO2 made of intrinsic semiconductor, so that the pin structure is formed. An electrode (first plug PL1) is connected to each of the p type semiconductor PR2 and the n type semiconductor NR2.

The carrier density in the optical waveguide WO2 made of intrinsic semiconductor is changed by the voltage applied to the electrode, and a refractive index in the region is changed. Consequently, an effective refractive index to the light propagating through the optical modulator PC is changed, so that the phase of light output from the optical modulator PC can be changed.

The optical modulator PC is covered with the first interlayer insulating film ID1, and connection holes (referred to also as contact hole) CT1 each reaching the p type semiconductor PR2 and the n type semiconductor NR2 are formed in the first interlayer insulating film ID1. A first plug (referred to also as buried electrode or buried contact) PL1 made of a material containing tungsten (W) as a main conductive material is formed in the connection hole CT1, and the first plug PL1 electrically connects the p type semiconductor PR2 and the first-layer wiring M1 and connects the n type semiconductor NR2 and the first-layer wiring M1. The first-layer wiring M1 is made of, for example, a material containing aluminum (Al), copper (Cu) or aluminum-copper alloy (Al—Cu alloy) as a main conductive material and a thickness thereof is smaller than, for example, 1 µm.

Further, the first-layer wiring M1 is covered with the second interlayer insulating film ID2, and a connection hole (referred to also as via hole) CT2 reaching the first-layer wiring M1 is formed in the second interlayer insulating film ID2. A second plug (buried electrode or buried contact) PL2 made of a material containing tungsten (W) as a main conductive material is formed in the connection hole CT2, and the second plug PL2 electrically connects the first-layer wiring M1 and the second-layer wiring M2. The second-layer wiring M2 is made of, for example, a material containing aluminum (Al), copper (Cu) or aluminum-copper alloy (Al—Cu alloy) as a main conductive material.

The second-layer wiring M2 is covered with the protection film PC and the protection film PC is partially opened to expose an upper surface of the second-layer wiring M2.

<Characteristic and Effect of Structure of Semiconductor Device>

Furthermore, as shown in FIG. 1, a plurality of trenches TR are formed in the insulating film CL formed on the semiconductor substrate SUB. A depth of the trench TR is 1 µm or more, but the trench TR does not pass through the insulating film CL and not reach the semiconductor substrate SUB. The specific depth of the trench TR is determined by the thickness of the insulating film CL or the arrangement of the trenches TR because compressive stress of the insulating film CL can be controlled in accordance with the depth of the trench TR. Moreover, it is desirable that a width of the trench TR is 1 µm or less and an aspect ratio thereof is 1 or more. However, the specific width of the trench TR is determined by a relationship between the depth and the aspect ratio of the trench TR and a restriction on a pattern layout.

Some of the trenches TR are not completely filled with the first interlayer insulating film ID1 and a gap (also referred to as void) VO is formed therein. However, since the aspect ratio of the trench TR is 1 or more, a top of the trench TR is completely closed by the first interlayer insulating film ID1 and the gap VO is not formed up to an upper surface of the first interlayer insulating film ID1, so that the flatness of the upper surface of the first interlayer insulating film ID1 is maintained.

The trench TR is formed in the optical signal transmission line section, but does not overlap with the semiconductor layer SL constituting the optical signal transmission line OTL (for example, rectangular optical waveguide PO or optical phase shifter PS) when seen in a plan view and is formed on both sides of the semiconductor layer SL while being separated from the semiconductor layer SL. Similarly, the trench TR is formed in the optical modulation section, but does not overlap with the semiconductor layer SL constituting the optical modulator PC when seen in a plan view and is formed on both sides of the semiconductor layer SL while being separated from the semiconductor layer SL. Further, the trench TR is formed to be in parallel to the semiconductor layer SL at a predetermined distance from the semiconductor layer SL when seen in a plan view. Note that, when two adjacent semiconductor layers SL are close to each other, the two adjacent semiconductor layers SL can share one trench TR instead of forming the trench TR on both sides of each of the semiconductor layers SL.

In an SOI wafer of the related art in which the trench TR is not formed, an insulating film needs to be formed on a rear surface of the SOI wafer in order to prevent warpage thereof. However, in the SOI wafer with an insulating film formed on the rear surface thereof, the residual adsorption force of an electrostatic chuck is larger compared to an SOI wafer having no insulating film formed on the rear surface thereof. If the insulating film is not formed on the rear surface of the SOI wafer, the residual adsorption force can be reduced. In this case, however, compressive stress of the insulating film CL causes warpage of the SOI wafer, and this sometimes causes such troubles as the movement of the SOI wafer on the electrostatic chuck and the conveyance failure of the SOI wafer.

Meanwhile, in the semiconductor device of the first embodiment, the insulating film on the rear surface of the SOI wafer is removed prior to processing the SOI wafer in the semiconductor manufacturing apparatus equipped with the electrostatic chuck. Thus, an electric charge can be more easily released from the SOI wafer even when the semiconductor manufacturing apparatus equipped with the electrostatic chuck is used. Therefore, the electric charge is less likely to be accumulated on the rear surface of the SOI wafer and the residual adsorption force of the electrostatic chuck is reduced, so that it is possible to prevent the SOI wafer from being stuck to the electrostatic chuck. Note that details thereof will be described later in the description of a manufacturing method of a semiconductor device.

Moreover, in the first embodiment, the semiconductor manufacturing apparatus equipped with the electrostatic chuck is used after removing the insulating film on the rear surface of the SOI wafer. However, since the plurality of trenches TR are formed in the insulating film CL, the compressive stress of the insulating film CL can be relaxed and the warpage of the SOI wafer can be reduced. As a result, it is possible to prevent such troubles as the movement of the SOI wafer on the electrostatic chuck and the conveyance failure of the SOI wafer.

Incidentally, it is desirable to form the trench TR until it reaches the semiconductor substrate SUB (until it passes through the insulating film CL) in order to relax the compressive stress of the insulating film CL and reduce the warpage of the SOI wafer. However, this gives rise to a new problem such as reduced strength of the SOI wafer or a long processing time required to form a deep trench TR, and thus the trench TR is formed to a depth not reaching the semiconductor substrate SUB. In the first embodiment, the thickness of the insulating film CL from the bottom of the trench TR to the upper surface of the semiconductor substrate SUB is set to be more than 0 μm and 1 μm or less. When the thickness of the insulating film CL from the bottom of the trench TR to the upper surface of the semiconductor substrate SUB falls within this range, it is possible to solve the problem of warpage of the SOI wafer due to the compressive stress of the insulating film CL.

<Manufacturing Method of Semiconductor Sevice>

The manufacturing method of the semiconductor device according to the first embodiment will be described along with the process order with reference to FIGS. 2 to 8. FIGS. 2 to 8 are cross-sectional views of a principal part of the semiconductor device in a manufacturing process of the first embodiment.

First, as shown in FIG. 2, an SOI (Silicon On Insulator) substrate (circular substrate referred to as SOI wafer in this stage) made up of the semiconductor substrate SUB, the insulating film CL formed on a main surface of the semiconductor substrate SUB, the semiconductor layer SL formed on the insulating film CL, and a rear insulating film RCL formed on a surface (also referred to as rear surface) opposite to the main surface of the semiconductor substrate SUB is prepared.

The semiconductor substrate SUB is a support substrate made of single crystal silicon (Si), the insulating film CL and the rear insulating film RCL are made of silicon oxide ($SiO_2$) and the semiconductor layer SL is made of silicon (Si). The thickness of the semiconductor substrate SUB is, for example, about 750 μm. The thickness of the insulating film CL and the rear insulating film RCL is, for example, 1 μm or more and preferably about 2 to 3 μm. The thickness of the semiconductor layer SL is, for example, about 100 to 300 μm and preferably about 200 μm.

The SOI substrate can be formed by, for example, the SIMOX (Silicon Implanted Oxide) method, the lamination method or the Smart-Cut method. In the SIMOX method, for example, the SOI substrate is formed by implanting an oxygen ion with high energy into a main surface of a semiconductor substrate made of silicon (Si) and forming an insulating film by bonding silicon (Si) and oxygen (O) in the subsequent heat treatment. In the lamination method, for example, the SOI substrate is formed by applying high heat and pressure to a semiconductor substrate made of silicon (Si) with an insulating film formed on an upper surface thereof and another semiconductor substrate made of silicon (Si) to adhere and laminate the substrates together and then polishing one of the semiconductor substrates into a thin film. Further, in the Smart-Cut method, for example, after an insulating film is formed on a main surface of a semiconductor substrate made of silicon (Si), the semiconductor substrate is subjected to hydrogen ion implantation and joined to another semiconductor substrate made of silicon (Si). Thereafter, the SOI substrate is formed by performing a heat treatment and peeling off one of the semiconductor substrates by the use of the hydrogen embrittlement phenomenon.

Next, a photoresist is applied onto the semiconductor layer SL and subjected to exposure followed by development process, thereby patterning the photoresist to form a first resist mask (not shown). Subsequently, dry etching is performed with using the first resist mask as a mask to process the semiconductor layer SL for the rectangular optical waveguide and the optical phase shifter in the optical signal transmission line section and the semiconductor layer SL for the optical modulator in the optical modulation section into a rectangular shape. Thereafter, the first resist mask is removed.

Moreover, a photoresist is applied onto the insulating film CL so as to cover the semiconductor layer SL processed into a rectangular shape and subjected to exposure followed by development process, thereby patterning the photoresist to form a second resist mask (not shown). Subsequently, dry etching is performed with using the second resist mask as a mask to process a part of the semiconductor layer SL for the optical phase shifter in the optical signal transmission line section (part where the p type semiconductor layer PR1 and the n type semiconductor layer NR1 are formed) to have predetermined thickness, so that the rib-type semiconductor layer SL for the optical phase shifter in the optical signal transmission line section is formed. Thereafter, the second resist mask is removed.

Next, an impurity is introduced into the semiconductor layer SL for each of the rectangular optical waveguide and the optical phase shifter in the optical signal transmission line section. The impurity concentration thereof falls within the range of, for example, $10^{15}$ to $10^{19}$ cm$^{-3}$, and a representative value thereof is, for example, about $10^{15}$ cm$^{-3}$. Moreover, a p type impurity is introduced into a part of the semiconductor layer SL for the optical phase shifter (part where the p type semiconductor PR1 is formed), and an n type impurity is introduced to another part (part where the n type semiconductor NR1 is formed).

Furthermore, a p type impurity is introduced into a part of the semiconductor layer SL for the optical modulator in the optical modulation section (part where the p type semiconductor PR2 is formed), and an n type impurity is introduced into another part (part where the n type semiconductor NR2 is formed).

Through the process described above, the rectangular optical waveguide PO and the rib-type optical phase shifter PS including the optical waveguide WO1, the p type semiconductor PR1 positioned on one side of the optical waveguide WO1 and the n type semiconductor NR1 positioned on the other side of the optical waveguide WO1 are formed in the optical signal transmission line section. Moreover, the optical modulator PC including the optical waveguide WO2, the p type semiconductor PR2 positioned on one side of the optical waveguide WO2 and the n type semiconductor NR2 positioned on the other side of the optical waveguide WO2 is formed in the optical modulation section.

Next, as shown in FIG. 3, the rear insulating film RCL formed on the rear surface of the semiconductor substrate SUB is removed by wet etching.

Then, as shown in FIG. 4, a photoresist is applied onto the insulating film CL so as to cover the rectangular optical waveguide PO and the optical phase shifter PS in the optical signal transmission line section and the optical modulator PC in the optical modulation section, and is subjected to exposure followed by development process, thereby patterning the photoresist to form a third resist mask (not shown). Subsequently, dry etching is performed with using the third resist mask as a mask to form the plurality of trenches TR in the insulating film CL. Thereafter, the third resist mask is removed.

The depth of the trench TR is 1 μm or more, but the trench TR does not reach the semiconductor substrate SUB. The specific depth of the trench TR is determined by the thickness of the insulating film CL or the arrangement of the trenches TR because compressive stress of the insulating film CL can be controlled in accordance with the depth of the trench TR. Moreover, it is desirable that the width of the trench TR is 1 μm or less and an aspect ratio thereof is 1 or more. However, a specific width of the trench TR is determined by a relationship between the depth and the aspect ratio of the trench TR and a restriction on a pattern layout.

The trench TR is formed in the optical signal transmission line section, but does not overlap with the semiconductor layer SL constituting the rectangular optical waveguide PO and the optical phase shifter PC when seen in a plan view and is formed on both sides of the semiconductor layer SL while being separated from the semiconductor layer SL.

Similarly, the trench TR is formed in the optical modulation section, but does not overlap with the semiconductor layer SL constituting the optical modulator PC when seen in a plan view and is formed on both sides of the semiconductor layer SL while being separated from the semiconductor layer SL. Further, the trench TR is formed to be in parallel to the semiconductor layer SL at a predetermined distance from the semiconductor layer SL when seen in a plan view. Note that, when two adjacent semiconductor layers SL are close to each other, the two adjacent semiconductor layers SL can share one trench TR instead of forming the trench TR on both sides of each of the semiconductor layers SL.

The trench TR does not have to be formed to pass through the semiconductor substrate SUB. In this manner, the compressive stress of the SOI substrate becomes 0 (zero) and warpage of the SOI substrate does not occur. However, when the trench TR passes through the semiconductor substrate SUB, the strength of the SOI substrate is decreased. In addition, a long processing time is required to form the deep trench TR. It is thus desirable to form the trench TR so as not to pass through the semiconductor substrate SUB. For example, it is desirable that the thickness of the insulating film CL from the bottom of the trench TR to the upper surface of the semiconductor substrate SUB is more than 0 μm and 1 μm or less. When the thickness of the insulating film CL from the bottom of the trench TR to the upper surface of the semiconductor substrate SUB is within this range, it is possible to solve the problem of warpage of the SOI wafer. Namely, even when the rear insulating film RCL is removed, the warpage of the SOI substrate can be reduced to the extent that such troubles as the movement of the SOI wafer on the electrostatic chuck and the conveyance failure of the SOI wafer do not occur.

The plurality of trenches TR are formed in the insulating film CL after removing the rear insulating film RCL by wet etching in the first embodiment, but the rear insulating film RCL may be removed by wet etching after forming the plurality of trenches TR in the insulating film CL. In addition, the rear insulating film RCL can be removed also in a process other than the above-mentioned process. The rear insulating film RCL is only required to be removed prior to the process using a semiconductor manufacturing apparatus in which the SOI substrate is likely to be stuck to the electrostatic chuck, for example, a process of processing the first-layer wiring M1 by the use of a plasma etching apparatus to be described later.

Figure 5:
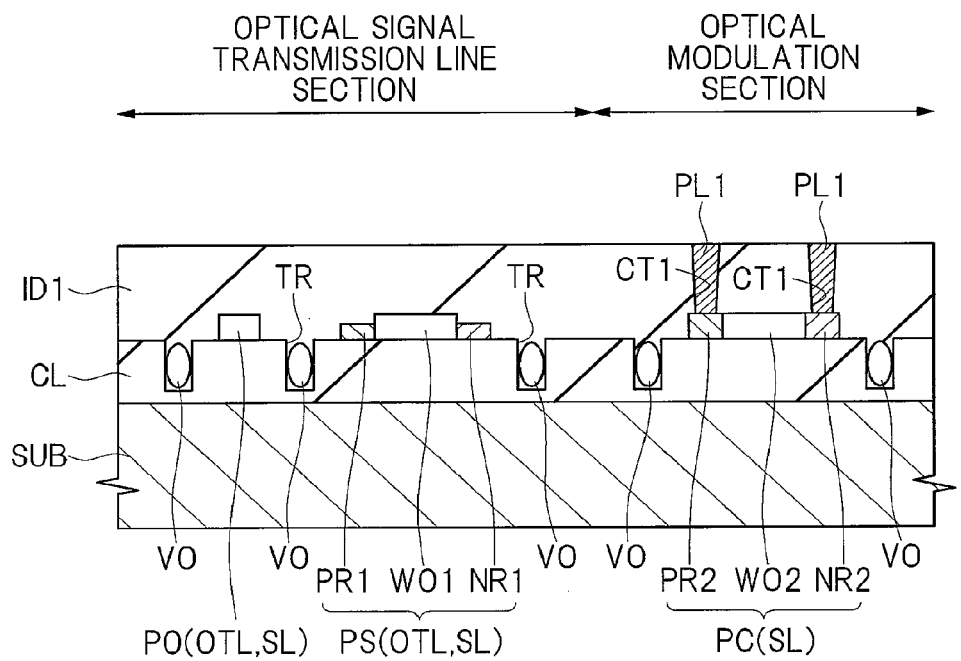
FIG. 5 is a cross-sectional view of a principal part showing the manufacturing process of the semiconductor device continued from FIG. 4.

Next, as shown in FIG. 5, the first interlayer insulating film ID1 is formed on the insulating film CL so as to cover the rectangular optical waveguide PO and the optical phase shifter PS in the optical signal transmission line section and the optical modulator PC in the optical modulation section. The first interlayer insulating film ID1 is made of, for example, silicon oxide ($SiO_2$) formed by using a parallel plate plasma CVD (Chemical Vapor Deposition) apparatus and the thickness thereof is, for example, 1 μm or more. Since the aspect ratio of the trench TR formed in the insulating film CL is 1 or more, the inside of the trench TR can be filled with the first interlayer insulating film ID1. Incidentally, the inside of the trench TR cannot be completely filled with the first interlayer insulating film ID1 and the gap VO is sometimes formed in the trench TR. However, since the aspect ratio of the trench TR is 1 or more, the top of the trench TR can be completely closed by the first interlayer insulating film ID1 even when the gap VO is formed, so that the gap VO is not formed up to the upper surface of the first interlayer insulating film ID1.

Next, the upper surface of the first interlayer insulating film ID1 is planarized by CMP (Chemical Mechanical Polishing) or the like, and then the connection hole CT1 reaching each of the p type semiconductor PR2 and the n type semiconductor NR2 of the optical modulator PC is formed in the first interlayer insulating film ID1. Subsequently, the connection hole CT1 is filled with a conductive film to form the first plug PL1 formed of the conductive film. The first plug PL1 is made of, for example, aluminum (Al) or tungsten (W).

Figure 6:
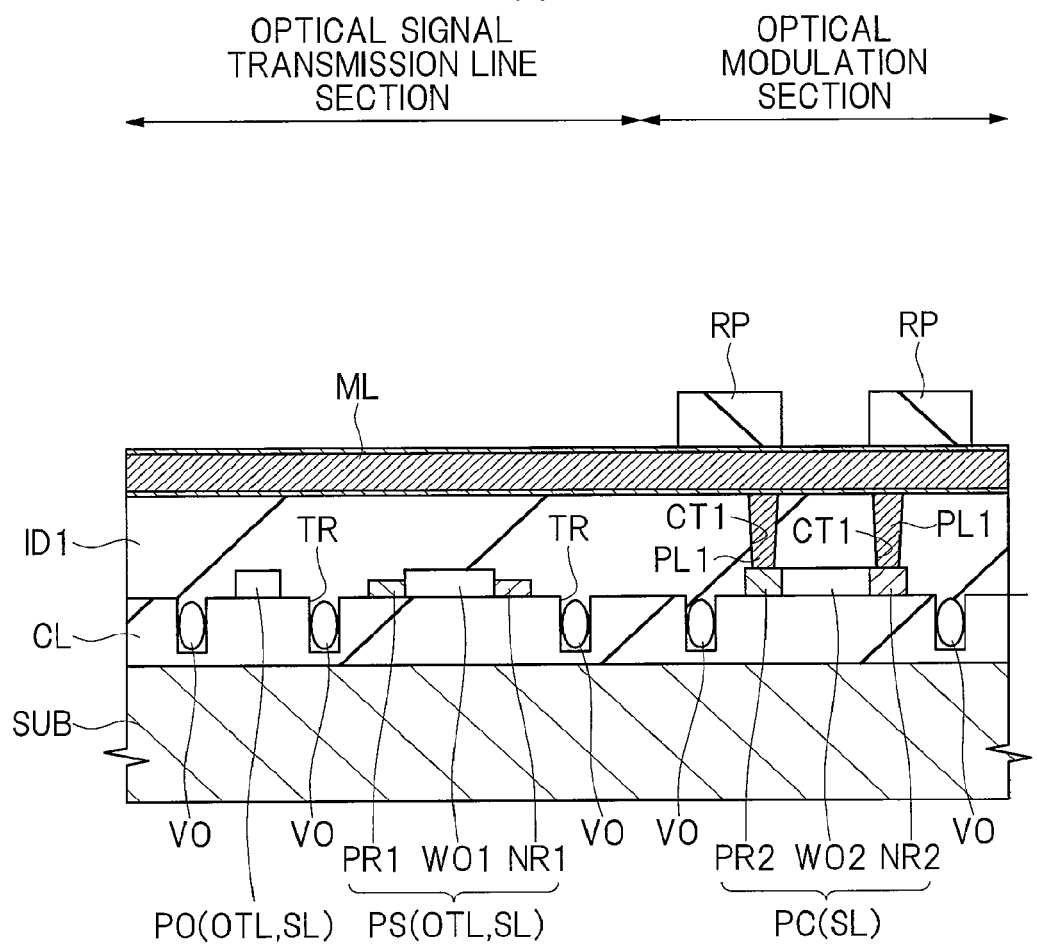
FIG. 6 is a cross-sectional view of a principal part showing the manufacturing process of the semiconductor device continued from FIG. 5.

Next, as shown in FIG. 6, a metal film ML, for example, an aluminum (Al) film is deposited on the first interlayer insulating film ID1 by sputtering or the like.

A photoresist is then applied onto the metal film ML and subjected to exposure followed by development process, thereby patterning the photoresist to form a fourth resist mask RP.

Figure 7:
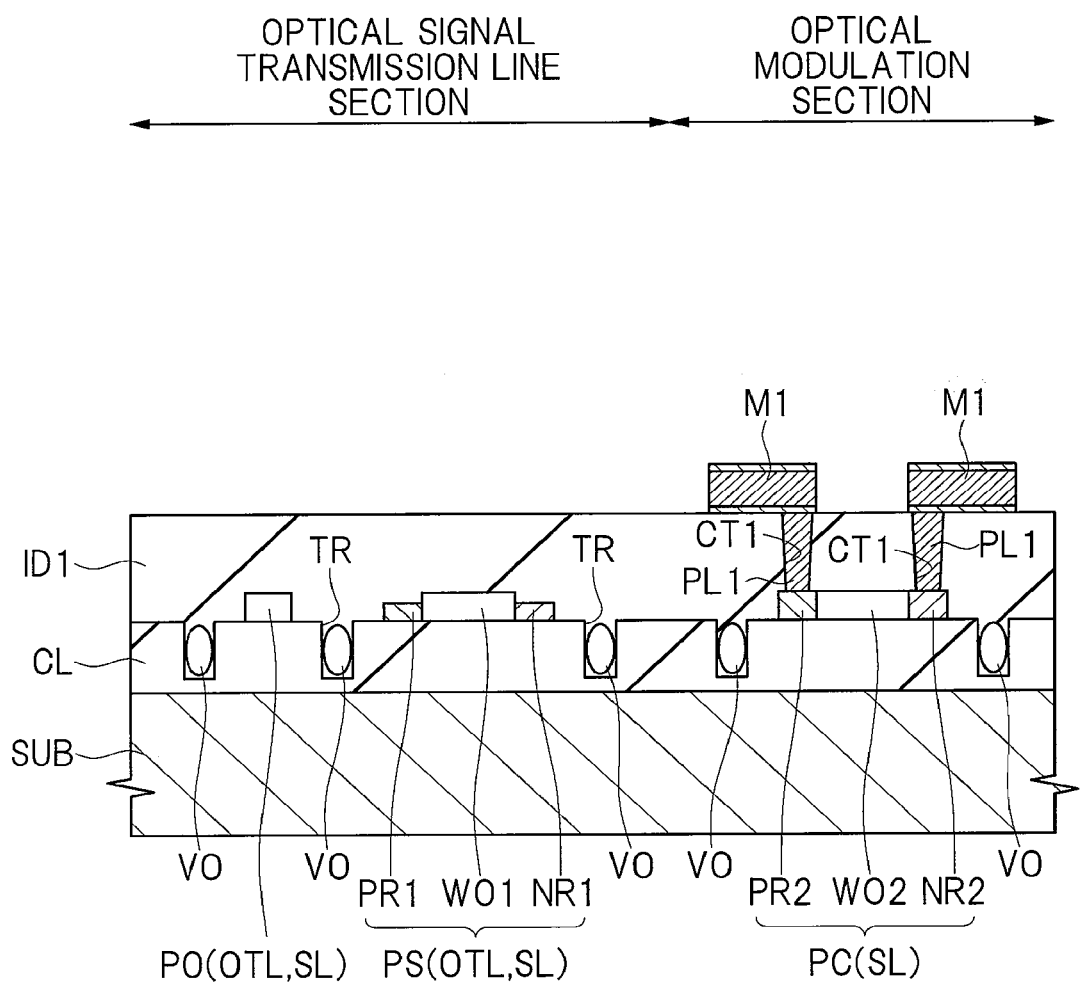
FIG. 7 is a cross-sectional view of a principal part showing the manufacturing process of the semiconductor device continued from FIG. 6.

Next, as shown in FIG. 7, the metal film ML is processed by dry etching using the fourth resist mask RP as a mask by the use of a plasma etching apparatus, thereby forming the first-layer wiring M1. Thereafter, the fourth resist mask RP is removed.

In the plasma etching apparatus, an electrostatic chuck is used to fix the SOI substrate to a stage in the apparatus. The electrostatic chuck is formed by mounting a desired dielectric with desired thickness to an electrode plate made of conductor metal, and the SOI substrate can be adsorbed, held and fixed on the stage by placing the SOI substrate on the electrostatic chuck and applying a voltage between the SOI substrate and the electrode plate to generate electrostatic force.

Incidentally, as described above, the SOI substrate is stuck to the electrostatic chuck in some cases because the residual adsorption force of the electrostatic chuck is not reduced due to an electric charge remaining on the SOI substrate. This sometimes causes such troubles as the cracking of the SOI substrate and the conveyance failure when separating the SOI substrate from the electrostatic chuck. In the case of the SOI substrate, the residual adsorption force is strong especially when an insulating film (for example, the rear insulating film RCL) is formed on the rear surface thereof.

In the first embodiment, however, the plurality of trenches TR are formed in the insulating film CL constituting the SOI substrate and the rear insulating film RCL formed on the rear surface of the SOI substrate is removed, and thus the electric charge can be easily released from the SOI substrate. Therefore, the electric charge is less likely to be accumulated on the rear surface of the SOI substrate and the residual adsorption force of the electrostatic chuck can be reduced, so that it is possible to prevent the SOI substrate from being stuck to the electrostatic chuck. Accordingly, such troubles as the cracking of the SOI substrate and the conveyance failure when separating the SOI substrate from the electrostatic chuck are less likely to occur.

Figure 8:
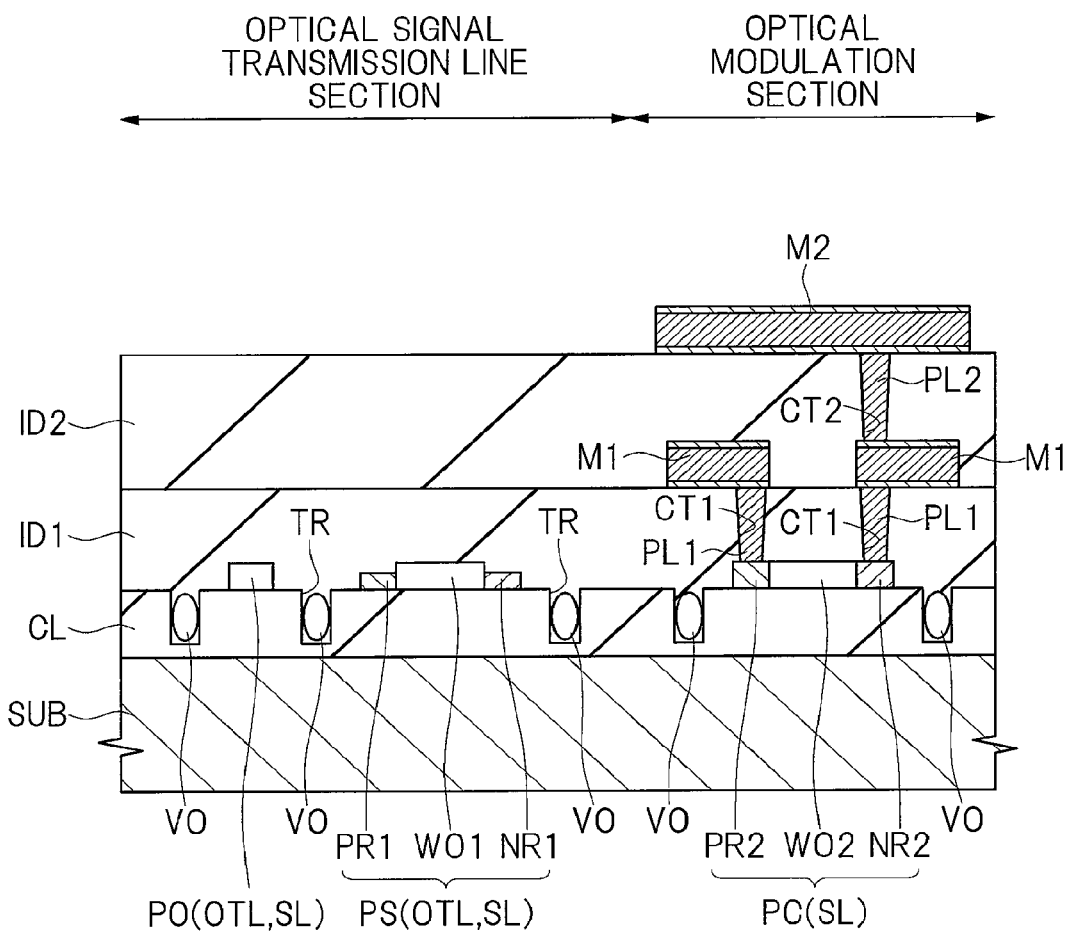
FIG. 8 is a cross-sectional view of a principal part showing the manufacturing process of the semiconductor device continued from FIG. 7.

Next, as shown in FIG. 8, the second interlayer insulating film ID2 is formed on the first interlayer insulating film ID1 so as to cover the first-layer wiring M1. The second interlayer insulating film ID2 is made of, for example, silicon oxide ($SiO_2$) formed by using a parallel plate plasma CVD apparatus and the thickness thereof is, for example, 1 μm or more.

Next, the upper surface of the second interlayer insulating film ID2 is planarized by CMP or the like, and then the connection hole CT2 reaching the first-layer wiring M1 is formed in the second interlayer insulating film ID2. Subsequently, the connection hole CT2 is filled with a conductive film to form the second plug PL2 formed of the conductive film. The second plug PL2 is made of, for example, aluminum (Al) or tungsten (W).

Next, a metal film (not shown) such as an aluminum (Al) film is deposited on the second interlayer insulating film ID2 by sputtering or the like, and then the metal film is processed by dry etching using a resist mask by the use of a plasma etching apparatus, thereby forming the second-layer wiring M2.

The plasma etching apparatus applied in the formation of the second-layer wiring M2 also uses the electrostatic chuck to fix the SOI substrate to a stage in the apparatus. However, like the above-mentioned plasma etching apparatus, the electric charge is less likely to be accumulated on the rear surface of the SOI substrate and the residual adsorption force of the electrostatic chuck can be reduced, so that it is possible to prevent the SOI substrate from being stuck to the electrostatic chuck. Accordingly, such troubles as the cracking of the SOI substrate and the conveyance failure when separating the SOI substrate from the electrostatic chuck are less likely to occur.

Thereafter, as shown in FIG. 1, the protection film TC is formed so as to cover the second-layer wiring M2, and then the protection film TC is processed to expose the upper surface of the second-layer wiring M2. In this manner, the semiconductor device of the first embodiment is almost completed.

In the first embodiment described above, since the electric charge can be easily released from the SOI wafer even when the semiconductor manufacturing apparatus equipped with the electrostatic chuck is used, the electric charge is less likely to be accumulated on the rear surface of the SOI wafer and the residual adsorption force of the electrostatic chuck is reduced, so that it is possible to prevent the SOI wafer from being stuck to the electrostatic chuck. Accordingly, such troubles as the cracking of the SOI wafer and the conveyance failure when separating the SOI wafer from the electrostatic chuck are less likely to occur.

Second Embodiment

Figure 9:
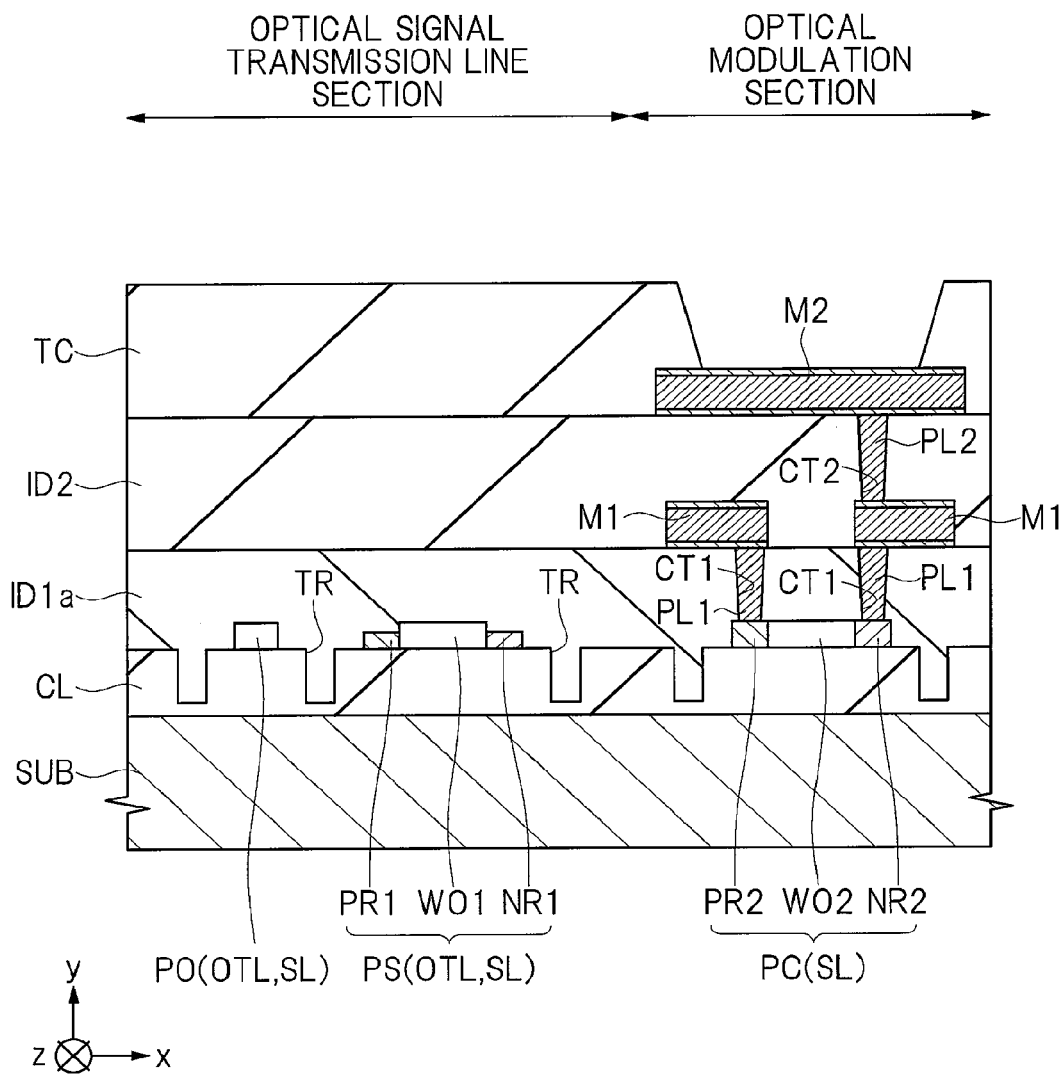
FIG. 9 is a cross-sectional view of a principal part of a semiconductor device of the second embodiment.

A structure of a semiconductor device employing the silicon photonics technology according to the second embodiment will be described with reference to FIG. 9. FIG. 9 is a cross-sectional view of a principal part of the semiconductor device of the second embodiment.

The second embodiment is different from the first embodiment in a first interlayer insulating film ID1a that covers the rectangular optical waveguide PO and the optical phase shifter PS in the optical signal transmission line section and the optical modulator PC in the optical modulation section. Namely, while the first interlayer insulating film ID1 made of silicon oxide ($SiO_2$) formed by the plasma CVD is used in the first embodiment, the first interlayer insulating film ID1a made of silicon oxide ($SiO_2$) with excellent coatability is used in the second embodiment. The first interlayer insulating film ID1a of the second embodiment is made of silicon oxide ($SiO_2$) formed by, for example, SACVD (Sub-Atmospheric Chemical Vapor Deposition) using TEOS (Tetra Ethyl Ortho Silicate: $Si(OC_2H_5)_4$) and ozone ($O_3$) as source gas.

The semiconductor device of the second embodiment has substantially the same structure as that of the semiconductor device of the first embodiment except for the configuration of the first interlayer insulating film, and thus the difference therebetween will be mainly described below.

Like the semiconductor device of the first embodiment, a plurality of trenches TR are formed in the insulating film CL formed on the semiconductor substrate SUB as shown in FIG. 9. The depth of the trench TR is 1 μm or more, but the trench TR does not pass through the insulating film CL and not reach the semiconductor substrate SUB. The specific depth of the trench TR is determined by the thickness of the insulating film CL or the arrangement of the trenches TR because compressive stress of the insulating film CL can be controlled in accordance with the depth of the trench TR. Moreover, it is desirable that the width of the trench TR is 1 μm or less and the aspect ratio thereof is 1 or more. However, a specific width of the trench TR is determined by a relationship between the depth and the aspect ratio of the trench TR and a restriction on a pattern layout.

Since the plurality of trenches TR are formed in the insulating film CL and an insulating film is not formed on a rear surface of the SOI wafer like in the first embodiment, an electric charge can be easily released from the SOI wafer even when a semiconductor manufacturing apparatus equipped with an electrostatic chuck is used. Therefore, the electric charge is less likely to be accumulated on the rear surface of the SOI wafer and the residual adsorption force of the electrostatic chuck is reduced, so that it is possible to prevent the SOI wafer from being stuck to the electrostatic chuck.

Moreover, the first interlayer insulating film ID1a with excellent coatability is embedded in the trench TR and almost no gap is formed in the trench TR, so that flatness of an upper surface of the first interlayer insulating film ID1a is maintained. The first interlayer insulating film ID1a is made of silicon oxide ($SiO_2$) formed by, for example, the SACVD using TEOS and ozone as the source gas (hereinafter referred to as a "TEOS oxide film"). The TEOS oxide film is excellent in coatability and the TEOS oxide film in the trench TR exhibits tensile stress. Since the insulating film CL exhibits compressive stress and the TEOS oxide film exhibits tensile stress, the overall warpage of the SOI wafer is cancelled out, and thus the warpage of the SOI wafer is reduced.

In addition, almost no gap is formed in the trench TR unlike in the first embodiment. Accordingly, irregular reflection of light due to the gap can be prevented.

The TEOS oxide film is formed by, for example, the SACVD using TEOS and ozone as the source gas. Silicon oxide ($SiO_2$) can grow in accordance with a reaction formula expressed in expression (1) by performing the gas phase reaction within the temperature range of 450 to 550° C. and the pressure range of 500 to 800 Torr. Thus, the TEOS oxide film can be formed.

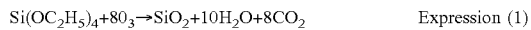

$$Si(OC_2H_5)_4 + 8O_3 \rightarrow SiO_2 + 10H_2O + 8CO_2 \qquad \text{Expression (1)}$$

Note that the TEOS oxide film is shown as an example of the insulating film with excellent coatability in the second embodiment, but the insulating film with excellent coatability is not limited to the TEOS oxide film.

Moreover, although the removal of the rear insulating film formed on the rear surface of the semiconductor substrate SUB is not described in the second embodiment, the rear insulating film can be removed in the same manner as that of the first embodiment. Namely, the rear insulating film may be removed after forming the rectangular optical waveguide PO and the optical phase shifter PS in the optical signal transmission line section and the optical modulator PC in the optical modulation section and prior to the process using the semiconductor manufacturing apparatus in which the SOI wafer is likely to be stuck to the electrostatic chuck, for example, a process of processing the first-layer wiring M1 by the use of a plasma etching apparatus.

As described above, substantially the same effect as that of the first embodiment described above can be obtained in the second embodiment.

Third Embodiment

Figure 10:
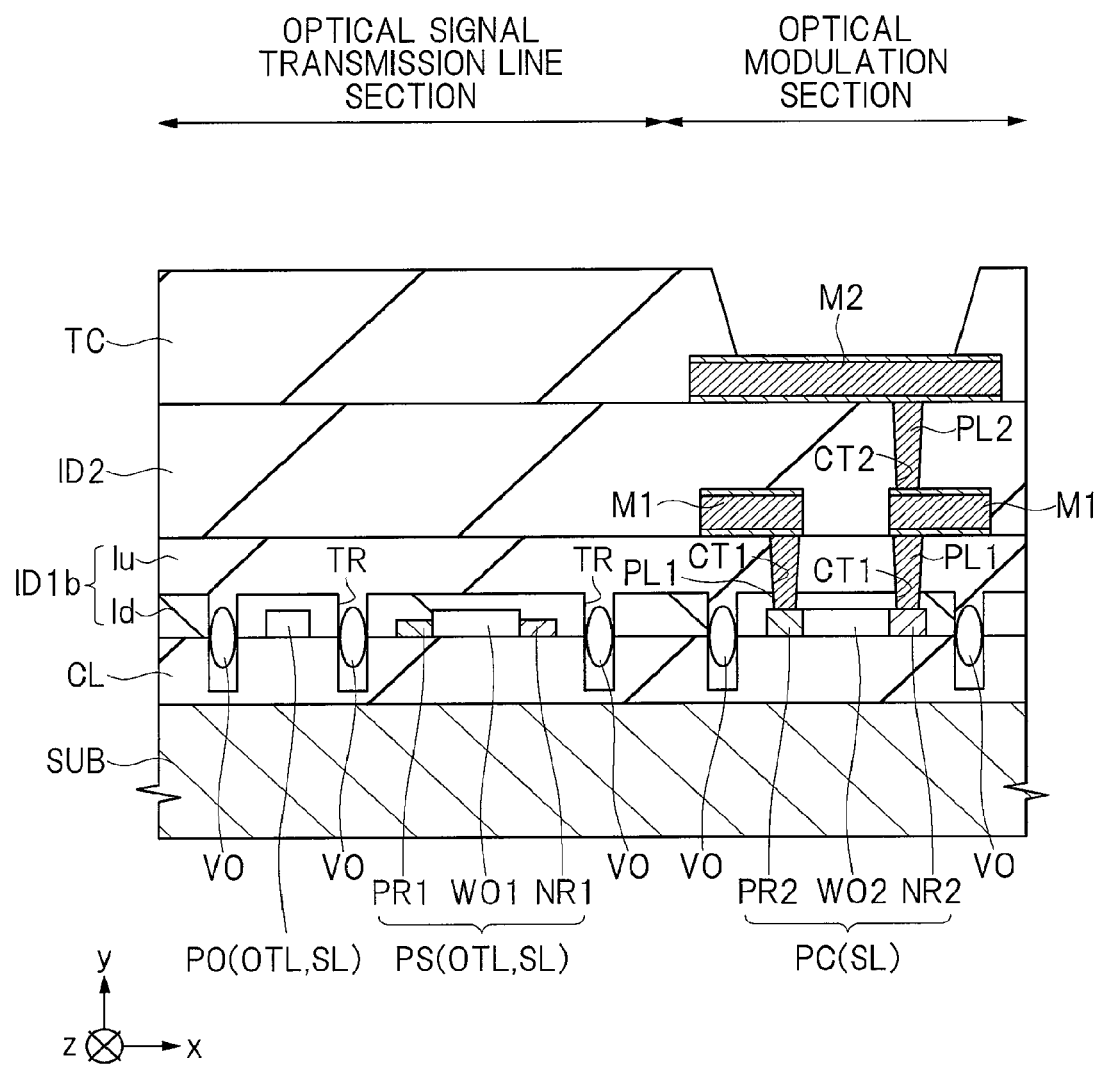
FIG. 10 is a cross-sectional view of a principal part of a semiconductor device of the third embodiment.

A structure of a semiconductor device employing the silicon photonics technology according to the third embodiment will be described with reference to FIG. 10. FIG. 10 is a cross-sectional view of a principal part of the semiconductor device according to the third embodiment.

The third embodiment is different from the first embodiment in a first interlayer insulating film ID1b that covers the rectangular optical waveguide PO and the optical phase shifter PS in the optical signal transmission line section and the optical modulator PC in the optical modulation section. Namely, while the first interlayer insulating film ID1 formed of a single layer of insulating film is used in the first embodiment described above, the first interlayer insulating film ID1b formed of at least two layers of insulating film is used in the third embodiment.

The semiconductor device of the third embodiment has substantially the same structure as that of the semiconductor device of the first embodiment except for the configuration of the first interlayer insulating film, and thus the difference therebetween will be mainly described below.

As shown in FIG. 10, the first interlayer insulating film ID1b covering the rectangular optical waveguide PO and the optical phase shifter PS in the optical signal transmission line section and the optical modulator PC in the optical modulation section is made up of a lower insulating film Id and an upper insulating film Iu. The lower insulating film Id is formed so as to cover the semiconductor layer SL formed on the insulating film CL. The thickness of the lower insulating film Id is, for example, about 1 μm.

Then, a plurality of trenches TR are formed contiguously in the lower insulating film Id and the insulating film CL. The depth of the trench TR is 1 μm or more, but the trench TR does not pass through the insulating film CL and not reach the semiconductor substrate SUB. The specific depth of the trench TR is determined by the thickness of the insulating film CL or the arrangement of the trenches TR because compressive stress of the insulating film CL can be controlled in accordance with the depth of the trench TR. Moreover, it is desirable that a width of the trench TR is 1 μm or less and an aspect ratio thereof is 1 or more. However, a specific width of the trench TR is determined by a relationship between the depth and the aspect ratio of the trench TR and a restriction on a pattern layout.

Since the plurality of trenches TR are formed in the insulating film CL and an insulating film is not formed on a rear surface of the SOI wafer like in the first embodiment, an electric charge can be easily released from the SOI wafer even when a semiconductor manufacturing apparatus equipped with an electrostatic chuck is used. Therefore, the electric charge is less likely to be accumulated on the rear surface of the SOI wafer and the residual adsorption force of the electrostatic chuck is reduced, so that it is possible to prevent the SOI wafer from being stuck to the electrostatic chuck.

The upper insulating film Iu is formed so as to cover the lower insulating film Id. The upper insulating film Iu is made of silicon oxide ($SiO_2$) formed by using, for example, a parallel plate plasma CVD apparatus and the thickness thereof is, for example, 1 μm or more. The thickness of each of the lower insulating film Id and the upper insulating film Iu is set so that a total thickness of the films becomes, for example, 2 μm or more. Since the aspect ratio of the trench TR formed in the insulating film CL and the lower insulating film Id is 1 or more, the inside of the trench TR can be filled with the upper insulating film Iu. Incidentally, the inside of the trench TR cannot be completely filled with the upper insulating film Iu and the gap VO is formed in the trench TR in some cases. However, since the aspect ratio of the trench TR is 1 or more, the top of the trench TR can be completely closed by the upper insulating film Iu even when the gap VO is formed, so that the gap VO is not formed up to the upper surface of the upper insulating film Iu.

Moreover, the gap VO needs to be formed in the trench TR that is formed in the insulating film CL. This is because the compressive stress of the insulating film CL can be relaxed by forming the gap VO in the trench TR that is formed in the insulating film CL.

In the first embodiment described above, the plurality of trenches TR are formed in the insulating film CL by dry etching using a resist mask, and the removal of the resist mask by, for example, ashing and the cleansing process are then performed. At this time, a surface of the semiconductor layer SL is also subjected to the ashing and the cleansing process, and thus there is a concern that the exposed surface of the semiconductor layer SL may be roughened to degrade the optical characteristics.

Meanwhile, the plurality of trenches TR are formed in the insulating film CL and the lower insulating film Id by dry etching using a resist mask also in the third embodiment, but the surface of the semiconductor layer SL is covered with the lower insulating film Id at this time. Therefore, the surface of the semiconductor layer SL is not roughened and the optical characteristics are not degraded even when the asking and the cleansing process are performed.

Note that the upper insulating film Iu is made of silicon oxide ($SiO_2$) formed by the plasma CVD in the third embodiment, but is not limited to this. For example, an insulating film with excellent coatability such as a TEOS oxide film described in the second embodiment may also be used.

Moreover, although the removal of the rear insulating film formed on the rear surface of the semiconductor substrate SUB is not described in the third embodiment, the rear insulating film can be removed in the same manner as that of the first embodiment. Namely, the rear insulating film may be removed after forming the rectangular optical waveguide PO and the optical phase shifter PS in the optical signal transmission line section and the optical modulator PC in the optical modulation section and prior to the process using the semiconductor manufacturing apparatus in which the SOI wafer is likely to be stuck to the electrostatic chuck, for example, a process of processing the first-layer wiring M1 by the use of a plasma etching apparatus.

As described above, an effect substantially the same as that of the first and second embodiments described above can be obtained in the third embodiment. In addition, since it is possible to prevent the surface of the semiconductor layer SL from being roughened in the manufacturing process of the semiconductor device, the degradation of the optical characteristics of the semiconductor device can be suppressed.

Fourth Embodiment

Figure 11:
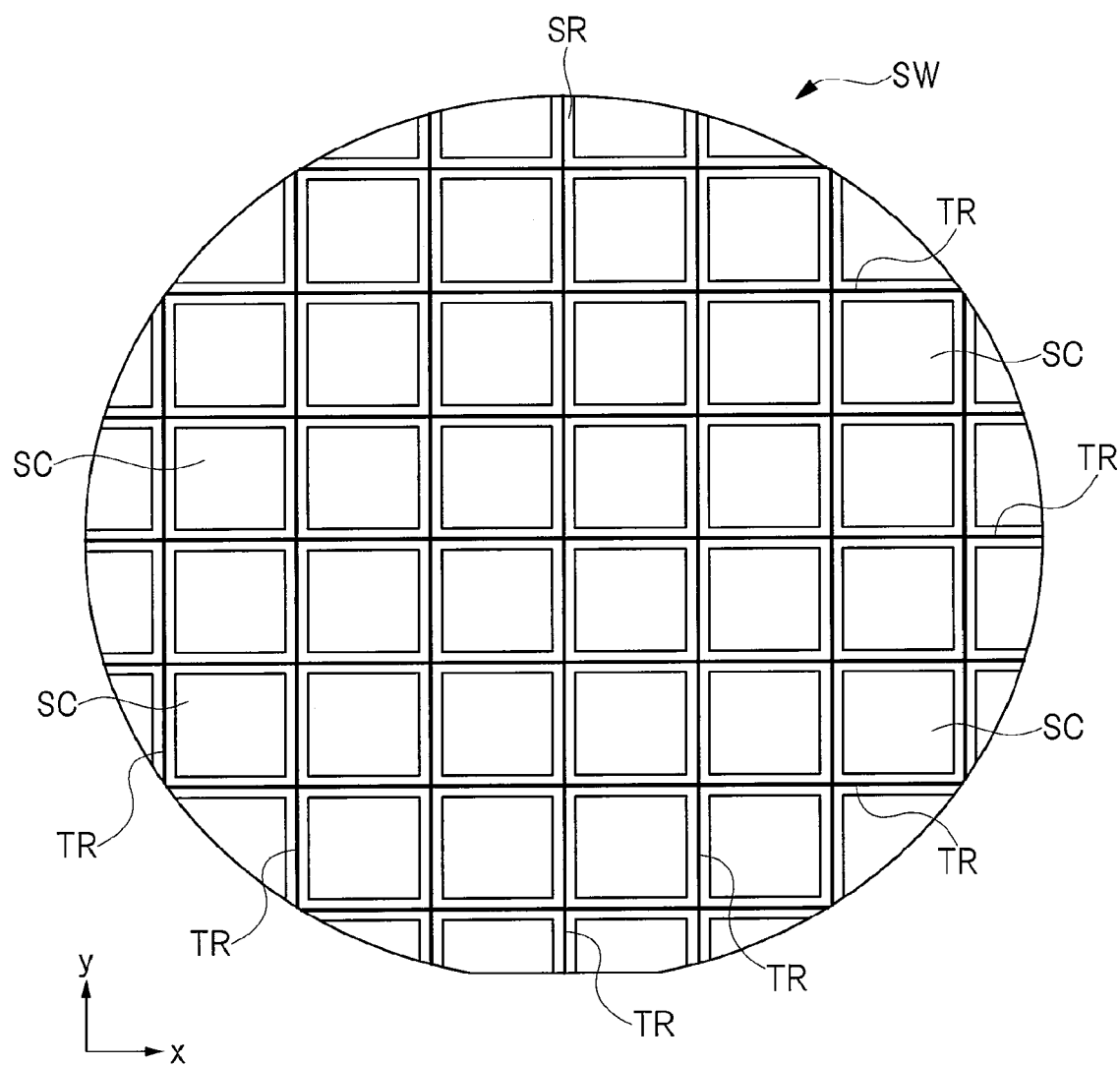
FIG. 11 is a plan view of a principal part of a semiconductor device of the fourth embodiment.
Figure 12:
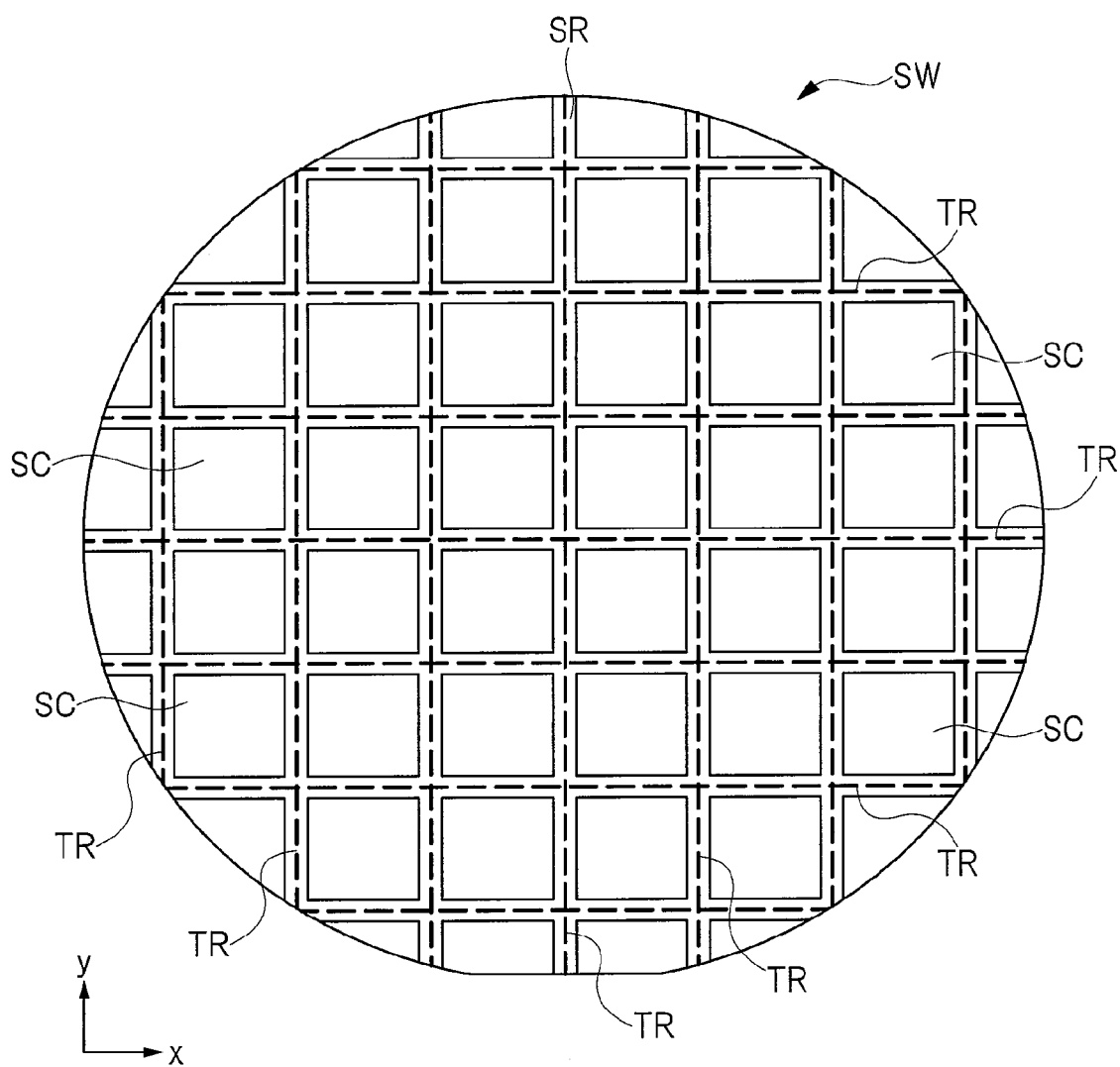
FIG. 12 is a plan view of a principal part of a semiconductor device of a first modification example of the fourth embodiment.
Figure 13:
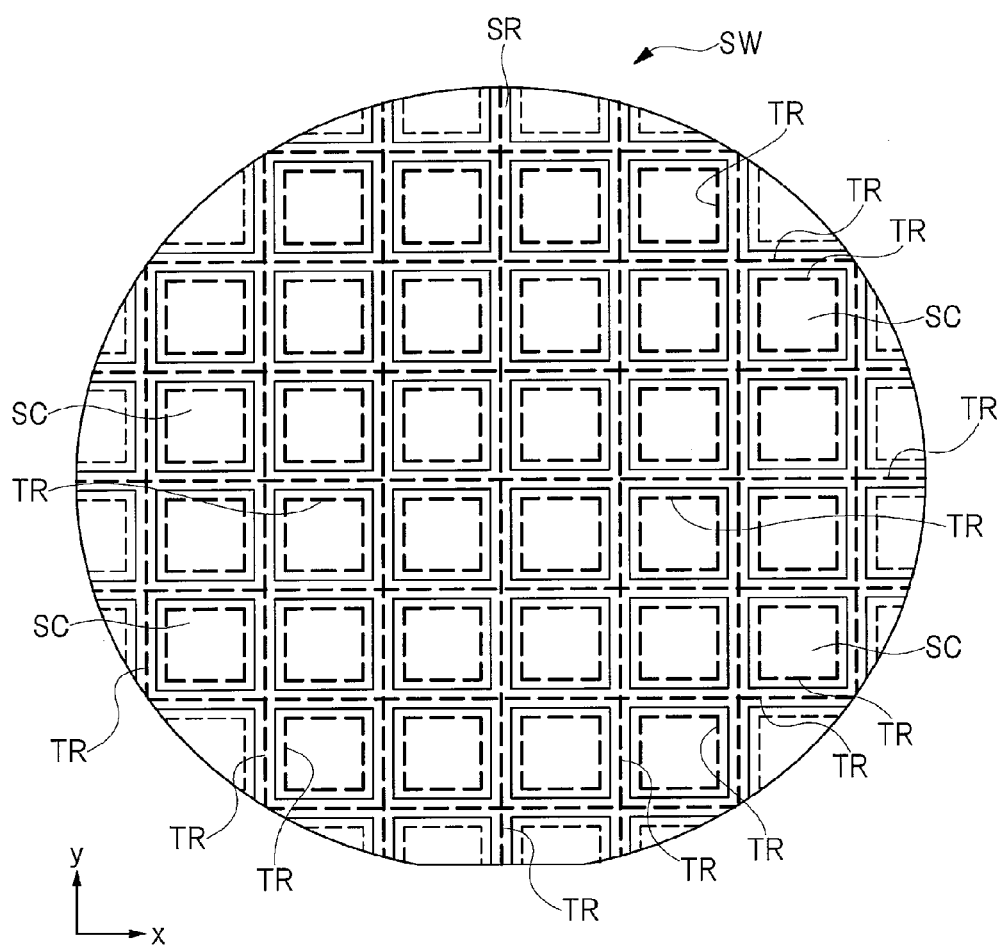
FIG. 13 is a plan view of a principal part of a semiconductor device of a second modification example of the fourth embodiment.
Figure 14:
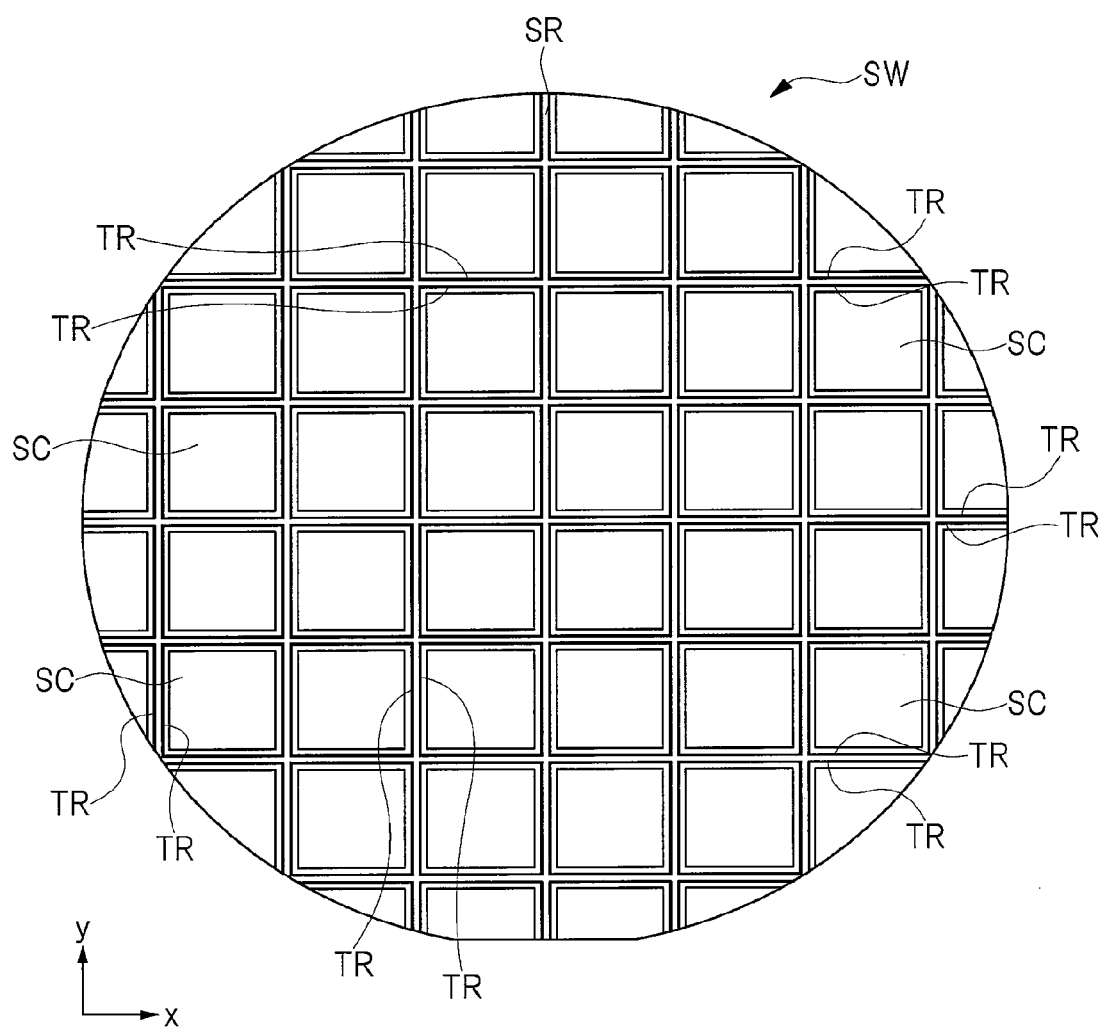
FIG. 14 is a plan view of a principal part of a semiconductor device of a third modification example of the fourth embodiment.

A structure of a semiconductor device employing the silicon photonics technology according to the fourth embodiment will be described with reference to FIGS. 11 to 14. FIG. 11 is a plan view of a principal part of the semiconductor device of the fourth embodiment. FIG. 12 is a plan view of a principal part of a semiconductor device of a first modification example of the fourth embodiment. FIG. 13 is a plan view of a principal part of a semiconductor device of a second modification example of the fourth embodiment. FIG. 14 is a plan view of a principal part of a semiconductor device of a third modification example of the fourth embodiment. Note that each of FIGS. 11 to 14 shows semiconductor chips formed on an SOI wafer in an enlarged manner for the purpose of clearly showing the arrangement of a plurality of trenches.

In the first, second and third embodiments described above, the trench TR is formed in the optical signal transmission line section and the optical modulation section in the semiconductor chip. Namely, the trench TR is formed on both sides of the semiconductor layer SL constituting the rectangular optical waveguide PO, the optical phase shifter PS and the optical modulator PC while being separated from the semiconductor layer SL so as not to overlap with the semiconductor layer SL when seen in a plan view.

However, the trench TR can be formed not only in the semiconductor chip but also in a scribe region (also referred to as scribe line or dicing region). The arrangement of the plurality of trenches TR can be modified in various ways. The scribe region is a region provided between adjacent semiconductor chips for cutting the SOI wafer into individual semiconductor chips and has the width of, for example, 100 μm or less.

As shown in FIG. 11, linear trenches TR are formed along the scribe region SR extending in an X direction and a Y direction orthogonal to the X direction on a main surface of the SOI wafer SW when seen in a plan view. The trench TR is not limited to the linear trench but may be, for example, a broken-line-like trench TR in which a plurality of trenches TR are formed at a fixed interval when seen in a plan view as shown in FIG. 12.

Alternatively, as shown in FIG. 13, it is also possible to form the broken-line-like trench TR along the scribe region SR formed on the SOI wafer SW and further form the broken-line-like trench TR in the semiconductor chip SC when seen in a plan view.

In addition, as shown in FIG. 14, it is also possible to form the trench TR in the scribe region SR so as to surround an outer periphery of the individual semiconductor chips when seen in a plan view. In this case, two trenches TR are formed to be in parallel to each other in the scribe region SR provided between adjacent semiconductor chips.

Though not described here, a cross-sectional shape of the trench TR in the fourth embodiment is substantially the same as that of the first, second or third embodiment.

As described above, in the fourth embodiment, an effect substantially the same as that of the first, second and third embodiments can be obtained even when the trench TR is formed in the scribe region SR.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, the plasma etching apparatus and the plasma CVD apparatus are shown as the example of the semiconductor manufacturing apparatus equipped with the electrostatic chuck, but the semiconductor manufacturing apparatus is not limited thereto. The present invention can be applied to the case using any semiconductor manufacturing apparatus equipped with an electrostatic chuck such as an ion implantation device.

What is claimed is:

1. A semiconductor device comprising:
a semiconductor substrate;
a first insulating film formed on a main surface of the semiconductor substrate and having a trench formed therein;
an optical waveguide composed of a semiconductor layer formed on the first insulating film; and
a second insulating film covering the optical waveguide,
wherein the trench has a first depth from an upper surface of the first insulating film,
wherein the trench is spaced away from the optical waveguide when seen in plan view, and
wherein the first insulating film is in contact with a bottom surface of the optical waveguide.

2. The semiconductor device according to claim 1, wherein an aspect ratio of the trench is 1 or more.

3. The semiconductor device according to claim 1, wherein the trench does not pass through the first insulating film.

4. The semiconductor device according to claim 1, wherein an inside of the trench is not filled with the second insulating film.

5. The semiconductor device according to claim 4, wherein the second insulating film encloses a void within the trench.

6. The semiconductor device according to claim 1, wherein the trench extends along a same direction as the optical waveguide.

7. The semiconductor device according to claim 1, wherein, in plan view, the trench and the optical waveguide are arranged next to each other.

8. The semiconductor device according to claim 1,
wherein the trench has a bottom at the first depth and extends from the upper surface of the first insulating film to the bottom, and
the bottom of the trench is between the upper surface of the first insulating film and a lower surface of the first insulating film in cross-sectional view.

9. The semiconductor device according to claim 1, wherein a portion of the second insulating film is formed within a portion of the trench adjacent to the upper surface of the first insulating film.

10. The semiconductor device according to claim 9, wherein the portion of the second insulating film encloses a void within the trench.

11. The semiconductor device according to claim 1, wherein the second insulating film is in contact with an upper surface and side surfaces of the optical waveguide.

* * * * *